United States Patent
Vissa et al.

(10) Patent No.: US 10,838,015 B2
(45) Date of Patent: Nov. 17, 2020

(54) APPARATUS AND METHOD FOR SENSOR BASED RADIO POWER CONTROL

(71) Applicant: MOTOROLA MOBILITY LLC, Chicago, IL (US)

(72) Inventors: Sudhir Vissa, Bensenville, IL (US); Vivek Tyagi, Chicago, IL (US); Douglas Lautner, Round Lake, IL (US); Scott Debates, Crystal Lake, IL (US)

(73) Assignee: MOTOROLA MOBILITY LLC, Chicago, IL (US)

( * ) Notice: Subject to any disclaimer, the term of this patent is extended or adjusted under 35 U.S.C. 154(b) by 596 days.

(21) Appl. No.: 15/730,715

(22) Filed: Oct. 11, 2017

(65) Prior Publication Data

US 2019/0107582 A1    Apr. 11, 2019

(51) Int. Cl.
| | |
|---|---|
| *G01R 31/00* | (2006.01) |
| *G01R 31/396* | (2019.01) |
| *H02J 7/00* | (2006.01) |
| *H02J 50/20* | (2016.01) |
| *H04W 4/02* | (2018.01) |
| *H04W 4/20* | (2018.01) |
| *H04W 52/02* | (2009.01) |

(52) U.S. Cl.
CPC .......... *G01R 31/396* (2019.01); *H02J 7/0047* (2013.01); *H02J 50/20* (2016.02); *H04W 4/02* (2013.01); *H04W 4/20* (2013.01); *H04W 52/0251* (2013.01); *H02J 7/00034* (2020.01); *H02J 7/0048* (2020.01)

(58) Field of Classification Search
CPC combination set(s) only.
See application file for complete search history.

(56) References Cited

U.S. PATENT DOCUMENTS

| | | | | |
|---|---|---|---|---|
| 8,036,186 | B2 * | 10/2011 | Gupta | H04W 52/10 370/252 |
| 2005/0101340 | A1 * | 5/2005 | Archiable | H04W 52/367 455/522 |
| 2007/0129045 | A1 * | 6/2007 | Aerrabotu | H04W 52/0277 455/343.5 |
| 2015/0164391 | A1 * | 6/2015 | Hernandez-Rosas | A61B 5/742 600/365 |
| 2016/0234786 | A1 * | 8/2016 | Gaja | H04L 43/16 |

* cited by examiner

*Primary Examiner* — Jason B Bryan
(74) *Attorney, Agent, or Firm* — Cygan Law Offices P.C.; Joseph T. Cygan (57) ABSTRACT

A mobile device includes a wireless transceiver operative to establish a wireless connection with a connected device. The connected device may be either a peer-to-peer device or an access point. The mobile device also includes a battery monitor and a processor, operatively coupled to the wireless transceiver and to the battery monitor. The processor is operative to obtain a charge level from the battery monitor, and negotiate with a connected device for a transceiver power output level based on the charge level. The processor is also operative to control the wireless transceiver to reduce the wireless transceiver power output to the negotiated transceiver power output level in response to an acknowledgement message from the connected device.

20 Claims, 9 Drawing Sheets

APPARATUS AND METHOD FOR SENSOR BASED RADIO POWER CONTROL

FIELD OF THE DISCLOSURE

The present disclosure relates generally to wireless communication devices and more particularly to methods and apparatuses related to network scanning operations and radio power control.

BACKGROUND

During the course of operation, wireless communication devices that utilize peer-to-peer wireless connections, WiFi® or other wireless local area network (WLAN) protocols, scan for access points or peer devices and establish connections at full power such that the radio provides maximum range. Maximum range is desirable in order to discover as many surrounding accessible access points and other devices as possible with which a viable wireless connection may be established. As expected, operating the radio at full power to achieve maximum range decreases the useful charge time of the wireless communication device battery.

DETAILED DESCRIPTION

Briefly, the present disclosure provides a mobile device that includes a wireless transceiver operative to establish a wireless connection with a connected device. The connected device may be either a peer-to-peer device or an access point. The mobile device includes a battery monitor, and a processor, that is operatively coupled to the wireless transceiver and to the battery monitor. The processor is operative to obtain a charge level from the battery monitor, and negotiate with a connected device for a transceiver power output level based on the charge level. The processor controls the wireless transceiver to reduce the wireless transceiver power output to the negotiated transceiver power output level in response to an acknowledgement message from the connected device.

The mobile device may further include an inertial measurement unit, operatively coupled to the processor. The processor is further operative to obtain movement data from the inertial measurement unit and obtain received signal strength indication (RSSI) measurements from the wireless transceiver. The processor determines that the mobile device is moving with respect to a radio coverage area of the connected device based on the movement data and a change in RSSI measurements, and negotiates with the connected device for a new transceiver power output level based on the movement data and the change in RSSI measurements.

The mobile device may further include a sensor processor, operatively coupled to the processor, to the inertial measurement unit and to the battery monitor; and a group of sensors comprising touch sensors, an ambient light sensor and an audio monitor, operatively coupled to the sensor processor. The processor is operative to obtain sensor data from the group of sensors, from the sensor processor; determine the mobile device operational context using the sensor data; determine a battery discharge rate using the charge level and the mobile device operational context; and negotiate with the connected device for the new transceiver power output level based on the movement data, the change in RSSI measurements and the battery discharge rate.

The processor is operative to determine various mobile device operation contexts such as, but not limited to, "walking," "running," "driving," "device-in-hand," "device-in-pocket," "in a noisy environment," "in poor coverage area," "low battery power," "on public transportation," "at location x," "on a phone call," "at work," "at school," "in a meeting," "browsing," "texting," "phone call," "gaming," etc. The processor may be further operative to exchange various information with the connected device during negotiation of the connection such as, but not limited to, battery level and RSSI measurements; battery discharge rates; and operational contexts.

In some embodiments, the processor may include a power adjust module that is operative to send a power adjustment control signal to the wireless transceiver to reduce the wireless transceiver power output to the negotiated transceiver power output level in response to an acknowledgement message from the connected device. The power adjust module may be operative to receive the acknowledgement message from the connected device, and send the power adjustment control signal to the wireless transceiver in response to the acknowledgement message. In some embodiments, the processor may include a movement determination module that is operative to communicate with the sensor processor to obtain movement data from the inertial measurement unit.

The present disclosure also provides a method of operating a mobile device, which includes operating a wireless transceiver to establish a wireless connection with a connected device, which may be either a peer-to-peer device or an access point; obtaining a charge level from a mobile device battery monitor; negotiating with the connected device for a transceiver power output level based on the charge level; and controlling the wireless transceiver to reduce the wireless transceiver power output to the negotiated transceiver power output level in response to an acknowledgement message from the connected device.

The method may further include obtaining movement data from an inertial measurement unit; obtaining received signal strength indication (RSSI) measurements from the wireless transceiver; determining that the mobile device is moving with respect to a radio coverage area of the connected device based on the movement data and a change in RSSI measurements; and negotiating with the connected device for a new transceiver power output level based on the movement data and the change in RSSI measurements.

The method may further include obtaining sensor data from a group of sensors comprising touch sensors, an ambient light sensor and an audio monitor; determining the mobile device operational context using the sensor data; determining a battery discharge rate using the charge level and the mobile device operational context; and negotiating with the connected device for the new transceiver power output level based on the movement data, the change in RSSI measurements and the battery discharge rate.

The method may further include determining at least one mobile device operational context comprising: walking, running, driving, device-in-hand, device-in-pocket, in a noisy environment, in poor coverage area, low battery power, on public transportation, at location x, on a phone call, at work, at school, in a meeting, browsing, texting, phone call, gaming.

The method may further include exchanging battery level and RSSI measurements with the connected device during negotiation; exchanging battery discharge rates with the connected device during negotiation; or exchanging operational contexts with the connected device during negotiation.

The method may further include sending a power adjustment control signal to the wireless transceiver to reduce the wireless transceiver power output to the negotiated transceiver power output level in response to an acknowledgement message from the connected device.

The method may further include receiving, by a power adjust module, the acknowledgement message from the connected device; and sending, by the power adjust module, the power adjustment control signal to the wireless transceiver in response to the acknowledgement message.

The present disclosure also provides a mobile device that includes a wireless transceiver operative to establish a wireless connection with a connected device, in which the connected device may be either a peer-to-peer device or an access point. The mobile device includes a processor, that is operatively coupled to the wireless transceiver. The processor is operative to obtain a charge level from a battery monitor, obtain a network scan list from a connected device, and control the wireless transceiver to reduce the wireless transceiver power output to a negotiated transceiver power output level in response to negotiation with the connected device based on the charge level.

Figure 1A:
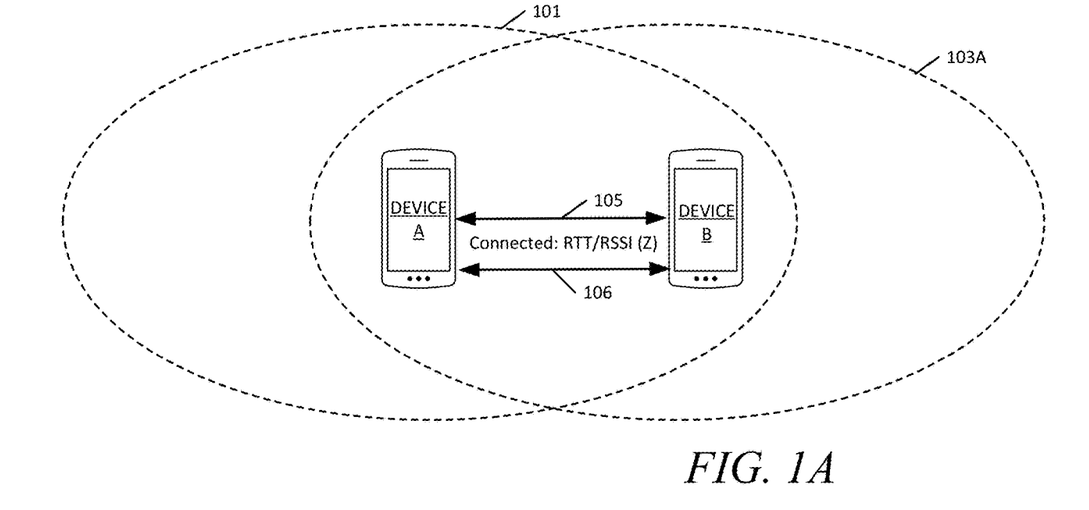
FIG. 1A is a diagram of two mobile devices, "device A" and "device B" initially connected via a wireless connection at full power such that device A has a has its full power radio range and device B has its full power radio range.
Figure 1B:
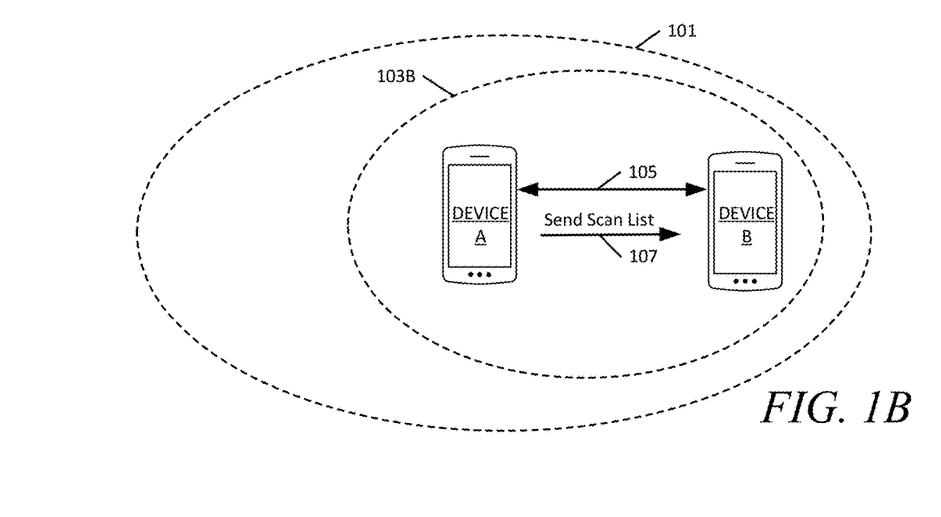
FIG. 1B illustrates a changed scenario from that shown in FIG. 1A, after the two mobile devices have completed a negotiation for the connection, and mobile device B has reduced its power level to a radio range which is adequate to maintain the connection with mobile device A, and receives a scan list from mobile device A in accordance with the embodiments.

Turning now to the drawings, FIG. 1A illustrates two mobile devices, "device A" and "device B" initially connected via wireless connection 105 at full power such that device A has radio range 101 and device B has radio range 103A. Subsequent to forming connection 105, in accordance with the embodiments, the two mobile devices begin a negotiation 106 in which they exchange context and/or modality information including their respective movement states, existing battery charge levels and existing or predicted battery discharge rates. FIG. 1B illustrates the changed scenario after the two mobile devices have completed the negotiation 106 for the connection 105 in accordance with the embodiments. In FIG. 1B, mobile device B has reduced its power level to radio range 103B which is adequate to maintain the connection 105 with mobile device A. Based on roles the mobile devices have been allocated during the negotiation 106, the mobile device A sends its scan list 107 to mobile device B over the connection 105. The mobile device exhibiting less movement and a higher battery charge rate will, in most cases be assigned the "managing device" role with the other device being assigned the role of "managed device." However, the context of the first mobile device may be such that the battery discharge rate is much higher than the second mobile device battery, despite the first mobile device battery having a higher initial charge. In this case the, second mobile device would be assigned the role of managing device because of its lower battery discharge rate, assuming other conditions allow it. The negotiation between the mobile devices takes into account, among other things, battery discharge rate due to context, as well as movement when making the role determination.

During the initial connection process, the mobile devices exchange some information such as for example, power level capability which in previous systems was used only to determine the radio ranges of the devices. In accordance with the embodiments, during negotiation of the connection, the mobile devices also exchange and compare context or modality information in which device context may be inferred using sensor data from various mobile device sensors. The mobile devices may also determine their respective existing or predicted battery discharge rates using the contexts and exchange the battery discharge rate information with each other during the negotiation 106 as well. The term "context information" as used herein includes "modality information" or is otherwise inferred using modality information. The term "modality" as used herein refers to information that can be obtained by the mobile devices by way of various applications and sensors operational within the mobile devices that sense operating conditions of the mobile devices as well as external environmental circumstances or conditions. Examples of modality information may include, but are not limited to, sensor data, data regarding the state of applications being run on a mobile device, data regarding state of a battery, connectivity, movement, position and velocity, and other information, etc. The term "context" as used herein is a broader term that encompasses modality and modality information and also includes a result or conclusion that may be drawn from analysis of the modality information to make an inference regarding the mobile device user's external environmental circumstances as well as operating conditions of the user's mobile device. Examples of context may include, but are not limited to, "walking," "running," "driving," "device-in-hand," "device-in-pocket," "in a noisy environment," "in poor coverage area," "low battery power," "on public transportation," "at location "x"," "on a phone call," "at work,", "at school," "in a meeting," "browsing," "texting," "phone call," "gaming," or other contexts, etc. that may be inferred using modality information.

During the negotiation 106, the devices determine the radio range 103B, which in this example corresponds to a minimum power level required for device B to stay connected to device A while maintaining a constant Received Signal Strength Indicator (RSSI) between the devices. The two devices coordinate the minimum power level change with respect to modality information, for example, battery levels or a battery state machine that reports states including: "plugged-in," "charged," "charge remaining," "last charged at," "discharging rate," or other states, etc.

The devices may also renegotiate based on certain modality changes. For example, when one of the device's battery is discharging at higher rate, the devices can renegotiate to determine which device can increase or decrease its radio power levels to match to the minimum power level requirement. Because one device will leverage the other device's scan list, that device need not throttle all the time in order to scan for other devices. In some embodiments, the devices can implement further network offloading where, for example, the device sending the scan list need not send the entire scan list but may only notify the receiving device when there a network of its interest based on information exchanged during the negotiation.

Figure 2A:
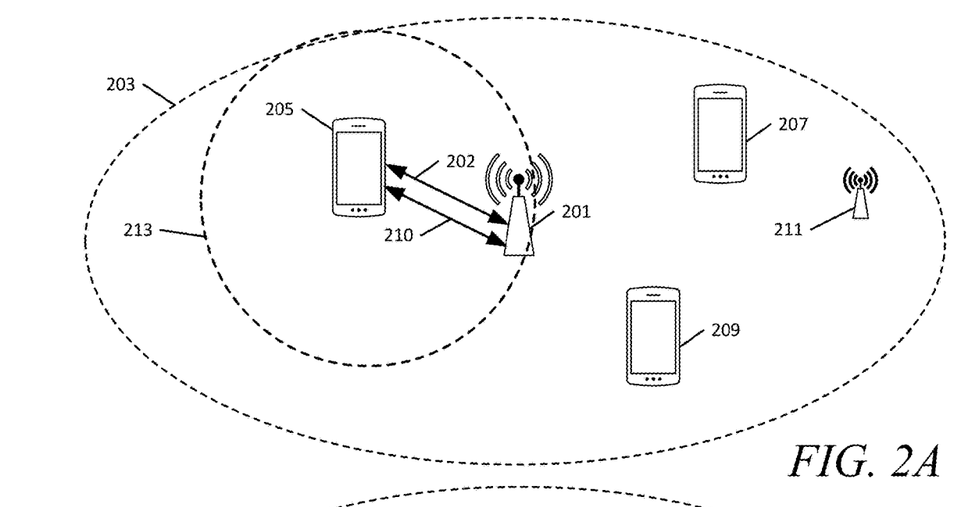
FIG. 2A is a diagram of a mobile device initially connected to an access point at full power, such that the mobile device has its maximum radio range.
Figure 2B:
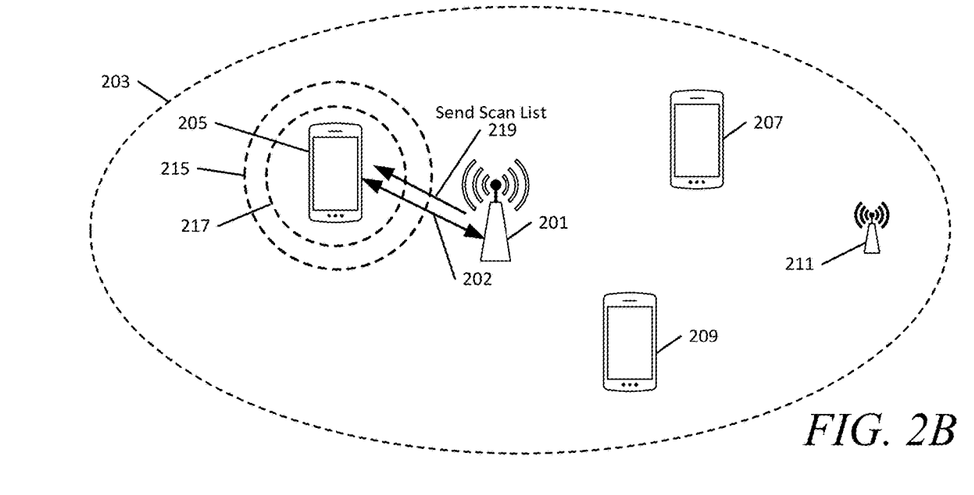
FIG. 2B illustrates a changed scenario from that shown in FIG. 2A, after the mobile device and access point have completed a negotiation for the connection, and the mobile device reduces its power level and receives a scan list from the access point in accordance with the embodiments.

Another example connection and negotiation operating method is illustrated in FIG. 2. In FIG. 2A a mobile device 205 is initially connected to an access point 201 via a connection 202 at full power such that the mobile device 205 has maximum radio range 213. The access point 201 has radio range 203 and is able to detect mobile device 207, mobile device 209 and distant access point 211. Subsequent to forming connection 202, in accordance with the embodiments, the mobile device 205 begins a negotiation 210 with the access point 201 and may provide modality information. FIG. 2B illustrates the changed scenario after the mobile device 205 and access point 201 have completed the negotiation 210 for the connection 202 in accordance with the embodiments. In the example scenario of FIG. 2B, mobile device 205 has reduced its power level to achieve minimum radio range 217 which is adequate to maintain the connection 202 with the access point 201. The mobile device 205 also begins to receive a scan list 219 from the access point 201 in accordance with an embodiment. Upon the occurrence of modality changes in device 205, the connection 202 is renegotiated and the mobile device 205 adjusts its power level to achieve radio range 215. This may occur based on a modality change such as, for example, a change in velocity or acceleration and direction of the mobile device 205 with respect to the access point 201.

Figure 3:
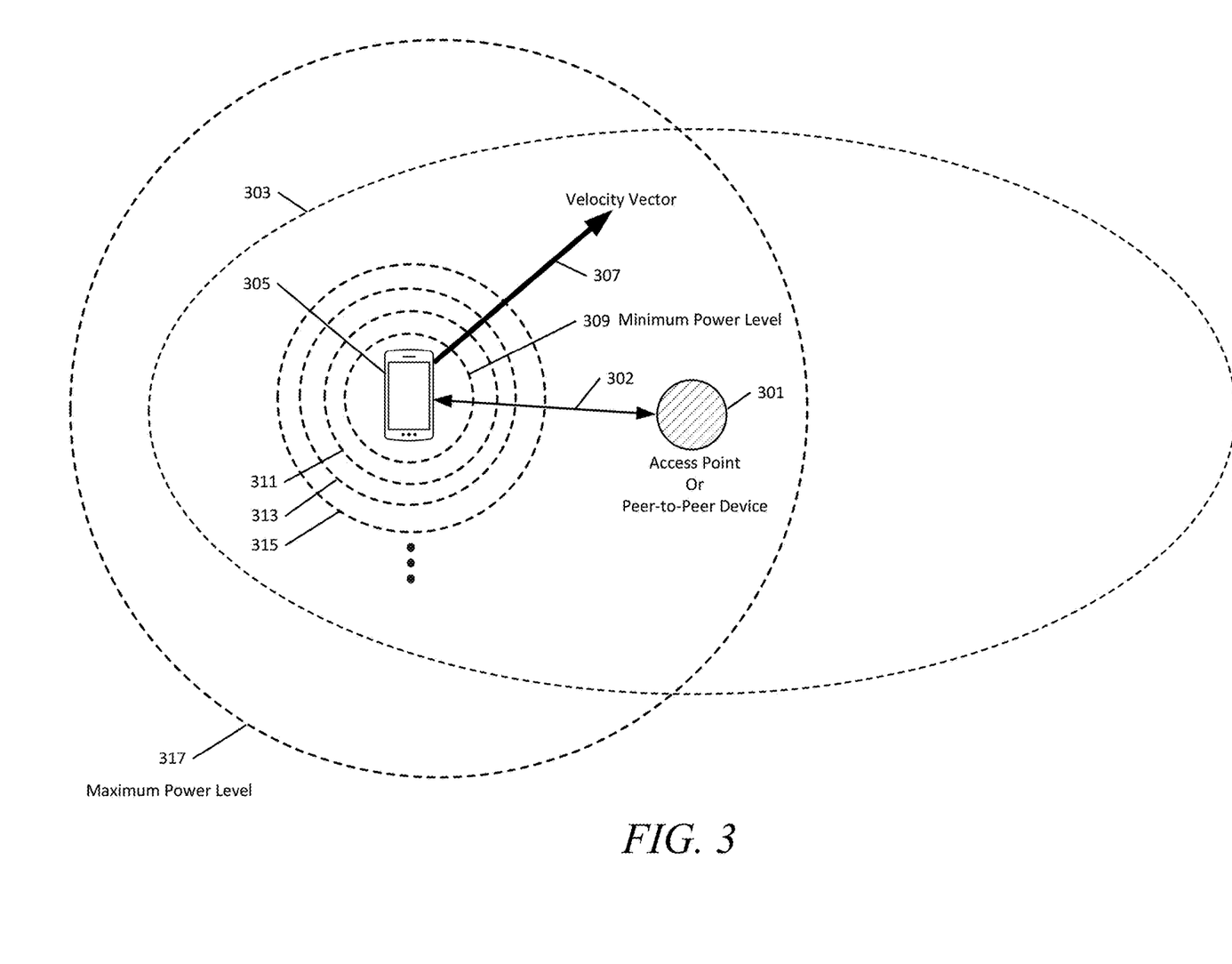
FIG. 3 is diagram showing a mobile device initially connected to an access point or a peer device at full power, reducing its power level and adjusting its power level based on its velocity vector in accordance with an embodiment.

FIG. 3 illustrates an example scenario in which an example mobile device 305 has a change in its velocity modality. The diagram of FIG. 3 shows the mobile device 305 initially connected to device 301, which may be either an access point or a peer device. The connection 302 between the mobile device 305 and access point 201 is made at full power. The mobile device 305 uses its maximum power level and has corresponding radio range 317 and the device 301 uses a power level to achieve radio range 303. After negotiation of the connection 302, mobile device 305 will reduce its power level to its minimum power level and radio range 309 which produces the required RSSI perceived by the device 301. When the mobile device 305 changes its velocity as illustrated by velocity vector 307, the mobile device 305 will inform device 301 and will adjust its power level and radio range accordingly. For example, if the velocity vector 307 indicates that the mobile device 305 is moving away from the device 301, or to a radio shadowed area, such that the RSSI drops at the device 301, the mobile device 305 may increase its power level to achieve various radio range increases 311, 313, 315 up to its maximum radio range 317.

Figure 4:
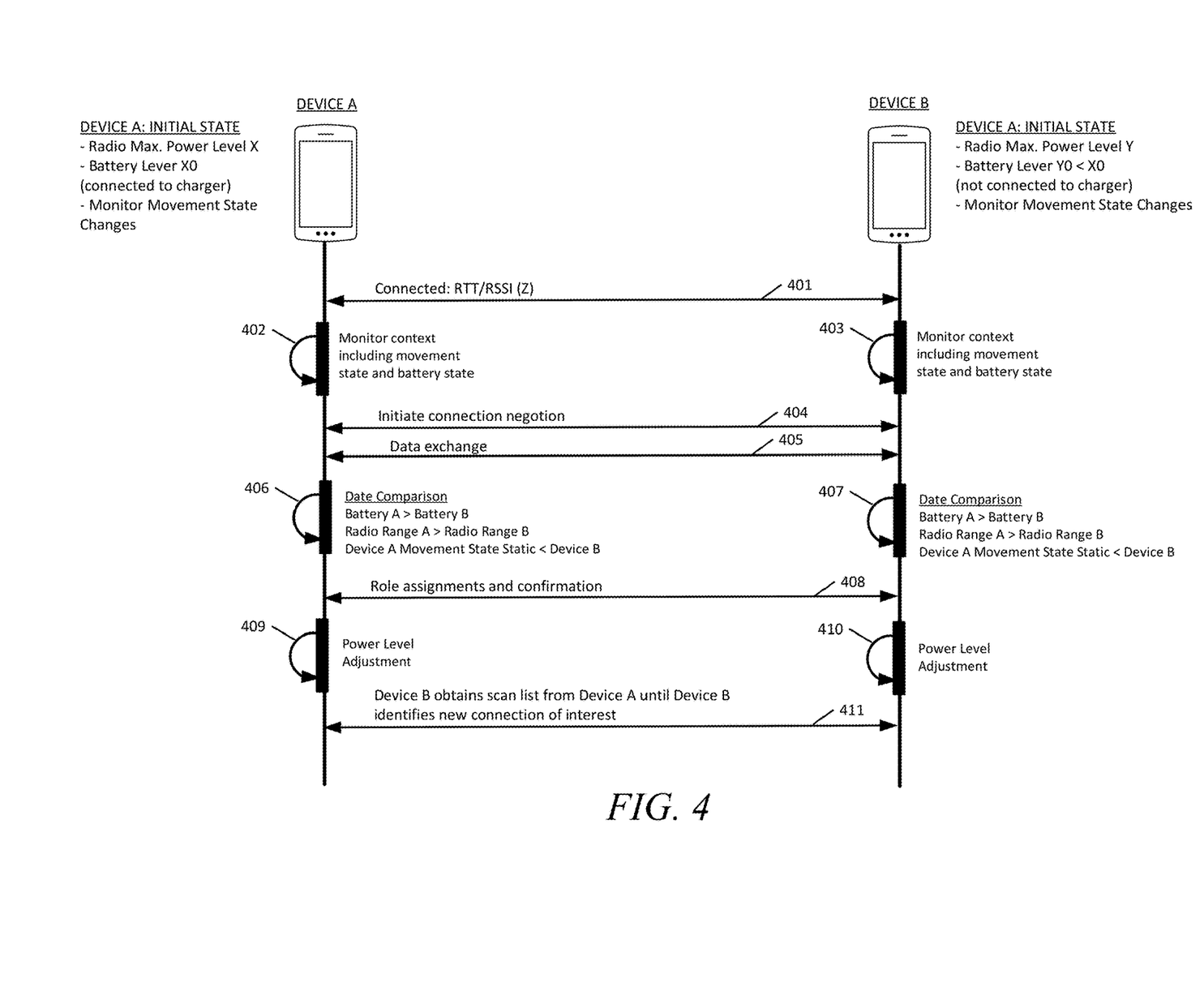
FIG. 4 is a ladder message flow diagram showing operations of two mobile devices in accordance with an embodiment.

An example method of operation is illustrated using a ladder message flow diagram in FIG. 4. In FIG. 4, mobile device A has its radio operating at maximum power level "X" and mobile device B has its radio operating at maximum power level "Y." The mobile device A also has battery level "X0" and mobile device B has battery level "Y0." At operation 401, mobile device A and mobile device B form a connection operating their respective radios at full power.

Each of the mobile devices then begins to monitor its respective contexts including movement states and battery states. Thus, mobile device A performs monitoring operation 402 and mobile device B performs monitoring operation 403. A movement state change is determined when a mobile device is in motion which is not static, and changes from one location to another location by moving a certain distance. In one example, a movement state that indicates walking is used as a trigger to inform the other device of a movement state change. If the RSSI level perceived by the moving mobile device decreases, this information can be used to infer that the mobile device is moving away from the connected device or is otherwise moving in a direction which may result in the connection being lost.

Next, one of the mobile devices sends a negotiation initiation message 404. In some embodiments, both mobile device A and mobile device B will send a negotiation initiation message. After one or both of the mobile devices receives the negotiation initiation message 404, the mobile devices perform a data exchange operation 405. In the example of FIG. 4, mobile device A has a battery level that is greater than the mobile device B battery level, and has a radio range that is greater than the mobile device B radio range. Mobile device A has a static movement state, and is connected to a charger, likely placed on a table or desktop. The mobile device B is in motion in this example and therefore, the mobile device A movement state is less than the mobile device B movement state.

Each of the devices performs a data comparison operation. Thus, mobile device a performs data comparison operation 406 and mobile device B performs data comparison operation 407. The results of the data comparisons should be the same. The mobile devices then perform role assignment and confirmation operations 408 to determine which device will be a managed device in which device will be a manager device. In the FIG. 4 example, mobile device A state suggests that it should be the managing device and that mobile device B should be the managed device.

Based on the data exchange operation 405, and the data comparison operations 406, 407, mobile device A performs power level adjustment operation 409, and mobile device B performs power level adjustment operation 410 such that the RSSI levels measured at each mobile device are substantially similar. In operation 411, the managing device sends its scan list to the managed device in accordance with the role assignments and confirmation operations 408.

The managed device, which is mobile device B in this example, leverages mobile device A's greater battery level and conserves its own battery power by eliminating the need to scan while connected to mobile device A. If the mobile device B movement state reaches a threshold and the RSSI measured by mobile device B from mobile device A also declines past a threshold, the mobile device B will use the mobile device A scan list to identify another connection that is better in terms of radio signal strength or some other parameter. In some embodiments, the managing device will send network connectivity information for networks of interest to the managed device in lieu of, or in addition to, operation 411. In one example, as the two devices move within the network the managing device may update its scan list as additional networks are detectable and may send these updates to the managed device, rather than sending, or resending the scan list.

Figure 5:
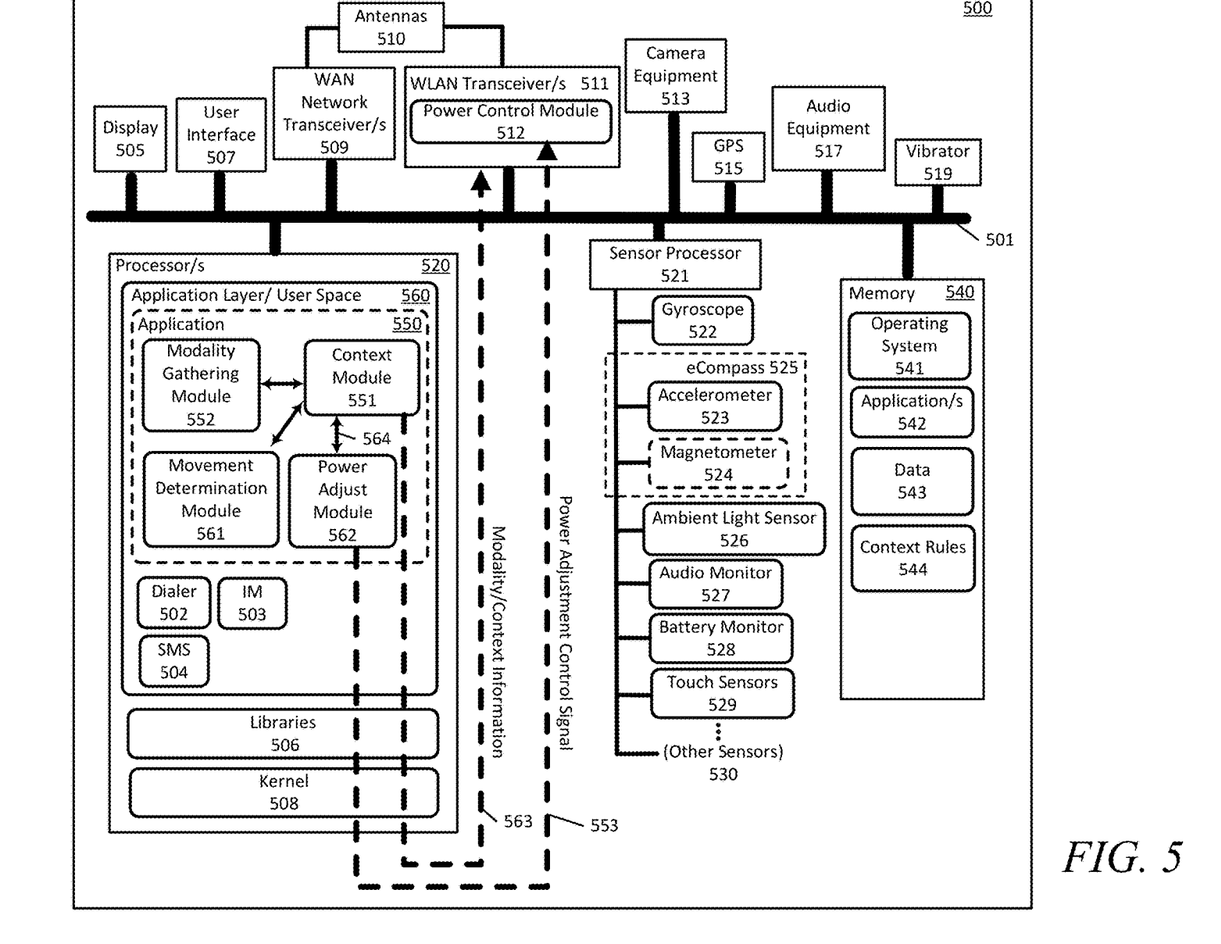
FIG. 5 is block diagram of a mobile device in accordance with an embodiment.

FIG. 5 is block diagram of an example mobile device 500 in accordance with an embodiment. The mobile device 500 includes a context module 551, a modality gathering module 552, a movement determination module 561 and a power adjust module 562. One or more of these modules may be implemented as an application 550 in some embodiments, or they may be independent modules in other embodiments. One of more of the context module 551, modality gathering module 552, movement determination module 561 and power adjust module 562 may be implemented as software or firmware (or as a combination of software and firmware) executing on one or more processors, and may also include, or may be implemented independently, using ASICs (application specific integrated circuits), DSPs (digital signal processors), hardwired circuitry (logic circuitry), or combinations thereof. That is, one or more of the context module 551, modality gathering module 552, movement determination module 561 and power adjust module 562 may be implemented using an ASIC, DSP, executable instructions executing on a processor, logic circuitry, or combinations thereof.

In the example of FIG. 5, the context module 551, the modality gathering module 552, the movement determination module 561 and the power adjust module 562 are implemented as executable instructions (i.e. as application 550) stored in memory 540 and executed by processor 520. In some embodiments, the movement determination module 561 may be integrated with the modality gathering module 552. The context module 551 is operatively coupled to the modality gathering module 552, the movement determination module 561 and the power adjust module 562 via a set of APIs 564. One or more internal connection buses 501 provide operative coupling between the processor 520 and the other various mobile device 500 components and therefore the modules can communicate with the various components over the internal connection buses 501. As used herein, components may be "operatively coupled" when information can be sent between such two components, even though there may be one or more intermediate or intervening components between, or along the connection path. Therefore, any of the various components connected to the internal connection buses 501 may be understood herein to be operatively coupled to the processor 520 or to each other where appropriate. Operative coupling may also exist between modules or components implemented as software or firmware executing on a processor and such "software coupling" may be implemented using libraries 506 (i.e. application programming interfaces (APIs)) such as APIs 564 or other software interfacing techniques as appropriate. Such libraries or APIs 564 are shown illustrated as providing operative coupling between various software implemented modules or components in FIG. 5.

The memory 540 is a non-volatile, non-transitory memory, and stores the executable instructions corresponding to various applications 542, and executable instructions corresponding to an operating system 541. The memory 540 may also store context rules 544 which may be used by a context engine to make inferences using modality information. The modality information may be stored as data 543 in memory 540. The data 543 may also include relational tables that related various contexts to battery discharge rates determined by previous empirical testing. These battery discharge rate tables may be accessed by context module 551 and conveyed to a connected device as modality/context information 563 during connection negotiations.

The operating system 541 executable instructions, when executed by processor 520, provide an application layer 560 (also referred to as user space 560) for running the various applications, libraries 506 and a kernel 508 which provides interfaces to various hardware components of the mobile device 500. The processor 520 is operative to access the memory 540 and execute the stored executable instructions to perform the methods of operation disclosed herein as well as to perform other functions and operations such as running the mobile device 500 operating system, etc.

The mobile device 500 includes audio equipment 517 with one or more microphones (such as a microphone array) and a speaker. The audio equipment 517 may also include, but is not limited to, analog-to-digital converters (ADCs), digital-to-analog converters (DACs), echo cancellation, high-pass filters, low-pass filters, band-pass filters, adjustable band filters, noise reduction filtering, automatic gain control (AGC) and other audio processing that may be applied to filter noise from audio received using the one or more microphones. Some audio processing components of the audio equipment 517 may be single components or may be implemented partly in hardware and partly in software or firmware executed by processor 520. In some embodiments, some or all of the processing of the audio equipment 517 may be implemented using several hardware components and may also utilize one or more software or firmware components in various combinations. The audio equipment 517 may include a headset jack capable of connecting to a headset accessory via a wire. Alternatively, a headset accessory can wirelessly connect to an antenna of the mobile device to operatively couple the audio equipment 517. The headset accessory may also include a microphone component in some embodiments where the microphone is also operatively coupled to audio processing of the audio equipment 517.

The wireless wide area network (WAN) transceiver 509 provides wireless communication capabilities for one or more wide area network communications systems using any of various technologies such as, but not limited to, CDMA, UMTS, GSM, LTE, etc. and also provides Internet connectivity over the wireless interface to communicate with various servers. A second wireless transceiver, WLAN transceiver 511, provides wireless local area network connections, peer-to-peer connections, etc. and may provide wireless connectivity using technologies such as, but not limited to, WiFi®, Bluetooth®, Wireless USB, ZigBee, or other technologies, etc. The WLAN transceiver 511 may also provide Internet connectivity. Both the WAN transceivers 509 and the WLAN transceiver 511 are operatively coupled to antennas 510 which may include a single antenna, multiple antennas, an antenna array or some combination thereof. The WLAN transceiver 511 includes a power control module 512 which is operatively coupled to power adjust module 562 and is operative to receive a power adjustment control signal 553 therefrom. The power adjust module 562 is operative to send power adjustment control signal 553 to power control module 512, based on predicted or existing battery discharge rates that are related to the mobile device 500 operational context. The mobile device operational context is determined or inferred by the context module 551 which uses modality information and/or movement information provided to it by the modality gathering module 552 and the movement determination module 561, respectively. The context module is operative to send modality and/or context information 563 to the WLAN transceivers 511 for transmission to a remote device during connection negotiation.

Modality gathering module 552 is operative to communicate with the sensor processor 521 to receive sensor data from the ambient light sensor 526, audio monitor 527, battery monitor 528, touch sensors 529, as well as other sensors 530. The context module 551, may use this modality information to infer, among other things, that the mobile device 500 is being held by the user in a certain way using a certain handgrip, is in the user's pocket, is placed on a table top, is connected to a charger, is in a noisy environment, or various other operational contexts. These various operational contexts may be used by the context module 551 to determine an impact on battery discharge rate similar to an approach discussed herein with respect to movement states. These various operational contexts may be communicated to the connected device as modality/contact information 563 sent to the WAN transceivers 511 for transmission to the connected device.

The context module 551 is operative to communicate with the modality gathering module 552, the movement determination module 561 and the power adjust module 562, using APIs 564. These APIs 564 are included in the libraries 506. The movement determination module 561 is operative to communicate with the sensor processor 521 to obtain movement modality information from the gyroscope 522, accelerometer 523 and magnetometer 524. The movement determination module 561 uses the movement modality information obtained from the sensors to determine a mobile device 500 velocity vector.

The movement determination module 561 may include various thresholds of movement that are used to trigger when the movement determination module 561 determines that a movement state change has occurred such that the state change should be communicated to the context module 551. In one example, if the velocity is over a certain magnitude, the movement determination module 561 will be able to infer that the user is walking or running. If the velocity magnitude is such that the user may be walking or running, then the movement determination module 561 will communicate a movement state change to the context module 551. In other words, velocity magnitude over a certain threshold will indicate that the user is moving in a certain direction at a certain rate and that, as a result, the radio connection to the connected device is an danger of being lost. The context module 551, is also operative to receive RSSI measurement information from the WLAN transceiver 511 such that a velocity over a given threshold in combination with a decrease in the RSSI measurement can be used to infer that mobile device 500 is moving away from the coverage range of the connected device and is in danger of losing the connection. The context module 551 may then communicate this information to the WLAN transceiver 511 for communication to the connected device in order to initiate renegotiation of the connection. Various other examples of how renegotiation of the connection may be triggered will occur to those of ordinary skill given the description of various examples provided herein.

In another example related to movement of mobile device 500, the movement determination module 561 may determine a velocity vector. The velocity vector information is conveyed by the movement determination module 561 to the context module 551 using APIs 564. In turn, the context module 551 uses the velocity vector information along with other modality information obtained from the modality gathering module 552, to make an overall inference as to the mobile device 500 operational context. For example, the context module 551 may determine or infer that the mobile device 500 user is walking while listening to music over a headset and moving away from the connected device. The context module 551 may also access the memory 540 and battery discharge rate tables from data 543. The context module 551 may therefore look up the battery discharge rate associated with the context of walking while listening to music over a headset or may calculate the battery discharge rate using other information stored in the table or the context rules 544. The context module 551 may then provide the expected battery discharge rate to the connected device as modality/context information 563, which is provided to the WLAN transceivers 511 for transmission to the connected device. The mobile device 500 and the connected device may then renegotiate the connection such that, for example, the connected device will increase its output power level.

Therefore, the context module 551 is operative to receive modality information from the modality gathering module 552 and from the movement determination module 551. The context module 551 is also operative to provide battery discharge rate information and battery level information to the power adjust module 562. The power adjust module 562 is operative to use the expected battery discharge rate and existing battery level information to determine the maximum radio range the WLAN transceivers 511 can achieve with respect to a given output power. Subsequent to agreement with the connected device via the negotiation, the power adjust module 562 is operative to send power adjustment control signal 553 to the power control module 512 to adjust the output power level of the WLAN transceivers 511. The negotiation is completed such that the RSSI level measured at the connected device will match the RSSI level measured at mobile device 500.

Global Positioning System (GPS) hardware 515 is operative to provide location data such as, but not limited to, GPS coordinates to the processor 520 and to various applications. The user interface (UI) 507 may include a track ball mouse, touch sensitive elements, physical switches, gyroscopic position sensors, etc. Some of the UI 507 sensors may be included in a group of sensors (i.e. touch sensors 529, "other" sensors 530 or combinations thereof).

The mobile device 500 includes a vibrator 519 that may be set to vibrate in response to receiving a phone call, SMS message or other communication in lieu of sending a ring tone or other notification sound to a speaker of the audio equipment 517. The mobile device may also include camera equipment 513 as is familiar to most mobile device users.

The sensor processor 521 monitors sensor data from the various sensors including the gyroscope 522, accelerometer 523, ambient light sensor (ALS) 526, audio monitor 527, battery monitor 528, touch sensors 529 (which may be capacitive sensors, photo sensors, or combinations thereof) as well as other sensors 530. The gyroscope 522 and accelerometer 523 may be separate or may be combined into a single integrated unit. In some embodiments, an eCompass 525 may include the accelerometer 523 along with a magnetometer 524. The gyroscope 522, accelerometer 523 and magnetometer 524 may be integrated into, or otherwise considered and referred to collectively as, an inertial measurement unit (IMU).

The sensor processor 521 is operative to provide monitoring and data conversion functions for data received by the various sensors and to provide sensor data to the processor 520. For example, some of the sensors may be used by the UI 507 to receive user inputs. For example, the gyroscope 522 and accelerometer 523 may be used to determine the position of the mobile device 500 and to facilitate various forms of user input for various applications when a user moves the mobile device 500 into various positions, or tilts or shakes the mobile device 500. In one example, the display 505 may be adjusted by sensing the position of the mobile device 500 as being horizontal or vertical, shaken or tilted or combinations thereof etc. The sensor processor 521 is thus operative to gather accelerometer 523 data, magnetometer 524 data, and gyroscope 522 data and send that data to the movement determination module 561 of processor 520 such that the mobile device 500 velocity vector can be determined.

The other sensors 530 may include thermal sensors and other sensors that may be used by the processor 520 to provide modality data to modality gathering module 552 or various other applications to adjust parameters of the mobile device 500 or for other purposes. The display 505 may be a liquid crystal display (LCD) and may provide a touchscreen capability that is part of the UI 507. The processor 520 is operative to control the display 505 to provide a graphical user interface (GUI) related to the mobile device 500 operating system, a GUI related to one or more mobile device applications or both. The display 505 may therefore be considered part of the UI 507 in that it may be operative to receive command and control signals directly by touch. The audio monitor 527 is operative to obtain audio samples from the audio equipment 517 and to from time-to-time send the audio samples to the sensor processor 521. The battery monitor 528 is operative to monitor DC battery drain and to report on the health and power levels of the battery (not shown) from time-to-time to the sensor processor 521.

All sensor data sent to the sensor processor 521, and any touch data obtained through touchscreen capability of the display 505, is considered "modality information" and is accordingly collected by the modality gathering module 552. Movement information is also "modality information" and is gathered by the movement determination module 561 in the present example. In some embodiments, the movement determination module may be integrated with the modality gathering module 552.

The context module 551 is operative to communicate with the modality gathering module 552 and with the movement determination module 561 using APIs 564. The context module 551 is operative to interact with the display 505 and with various communication mode applications such as, but not limited to, a telephone dialer 502, IM application 503 and SMS application 504 and with associated GUIs to determine the mobile device 500 context and to display context notifications in some embodiments. The context module 551 communicates with the movement determination module 561 to obtain movement information in addition to other sensor information received from the modality gathering module 552. The context module 551 uses the movement and other modality information to determine context states of the mobile device 500 such as, but not limited to, "walking," "running," "driving," "device-in-hand," "device-in-pocket," "in a noisy environment," "in poor coverage area," "low battery power," "on public transportation," "at location "x"," "on a phone call," "at work,", "at school," "in a meeting," "browsing," "texting," "phone call," "gaming," or other contexts, etc. that may be inferred using modality information including movement information such as velocity and acceleration.

In some embodiments, the context module 551 may also include a context engine which is able to make inferences using modality information obtained by the modality gathering module 552 and the movement determination module 561. In that case, the context engine may use context rules 544 stored in memory 540, and apply the context rules 544 to modality information at appropriate times when modality information changes are detected by the sensor processor 521 and the modality gathering module 552. The context module 551 in that case can associate context inferences with battery discharge rates and send that information to the power adjust module 562.

The power adjust module 562 is operative to send a power adjustment control signal 553 to the power control module 512. The power adjustment control signal 553 is sent by the processor 520 to the WLAN transceivers 511 over the internal connection buses 501 as a control signal to power control module 512. An API enables the context module 551 and the power adjust module 562 to communicate with one or more wireless protocol stacks to communicate with the power control module 512 (and corresponding transceivers) to send the power adjustment controls signal to adjust the power levels and therefore adjust the radio range of WLAN transceiver 511.

The power adjustment module 567 may operate independently of the context module 551 in some embodiments and may send a power adjustment control signal 553 to the power control module 512 in response to velocity of the mobile device 500 and measured RSSI measured by the WLAN transceiver 511, as well as velocity, context or RSSI changes reported to mobile device 500 by the connected device. The power adjust module 562 is operative to increase or decrease the power level used by the WLAN transceiver 511 in order to correspondingly increase or decrease the WLAN transceiver 511 transmission radio range in order to maintain a desired RSSI level at the connected device. Thus, if the power adjust module 562 receives a report from the connected device, the power adjust module 562 will adjust the WLAN transceiver 511 accordingly to maintain the RSSI levels measured at both devices.

Any of the above described components, including "modules," of mobile device 500 may be implemented as software or firmware (or a combination of software and firmware) executing on one or more processors, or using ASICs, (application-specific-integrated-circuits), DSPs (digital signal processors), hardwired circuitry (logic circuitry), state machines, FPGAs (field programmable gate arrays) or combinations thereof. Such software or firmware may be referred to herein as executable instructions or executable code and may be stored in non-volatile, non-transitory memory. Therefore, the mobile device 500 illustrated in FIG. 5 is one example of a mobile device and is not to be construed as a limitation on the various other possible mobile device implementations that may be used in accordance with the various embodiments. In embodiments in which one or more components is implemented as software, or partially in software/firmware, the executable instructions may be stored in the operatively coupled, non-volatile, non-transitory memory 540, or in on-chip or on-die non-volatile, non-transitory memory (not shown), or combinations thereof, and may be accessed by the processor 520, or other processors, as needed.

Therefore, in example embodiments, one or more of the context module 551, modality gathering module 552, movement determination module 561, or power adjust module may be implemented as a combination of software and firmware) executing on one or more processors. In some example embodiments, one or more of the context module 551, movement determination module 561, modality gathering module 552, or power adjust module 562 may be implemented as an ASIC. In another example embodiment, one or more of the context module 551, modality gathering module 552, movement determination module 561, or power adjust module 562 may be implemented using a DSP. In another example embodiment, one or more of the context module 551, modality gathering module 552, movement determination module 561, or power adjust module 562 may be implemented using an FPGA. Other embodiments having other implementations are contemplated by the present disclosure.

The various embodiments also include non-volatile, non-transitory computer readable memory, other than memory 540, that may contain executable instructions (i.e. executable code), for execution by at least one processor, that when executed, cause the at least one processor to operate in accordance with the functionality and methods of operation herein described. The computer readable memory may be any suitable non-volatile, non-transitory, memory such as, but not limited to, programmable chips such as EEPROMS, flash ROM (thumb drives), compact discs (CDs) digital video disks (DVDs), etc., that may be used to load executable instructions or program code to other processing devices such as servers, mobile devices or other devices such as those that may benefit from the features of the herein described embodiments. For example, applications 542 executable instructions for the context module 551, modality gathering module 552, movement determination module 561, or power adjust module 562, or each of these, may be stored on any of the above described forms of computer readable memory, etc.

Figure 6:
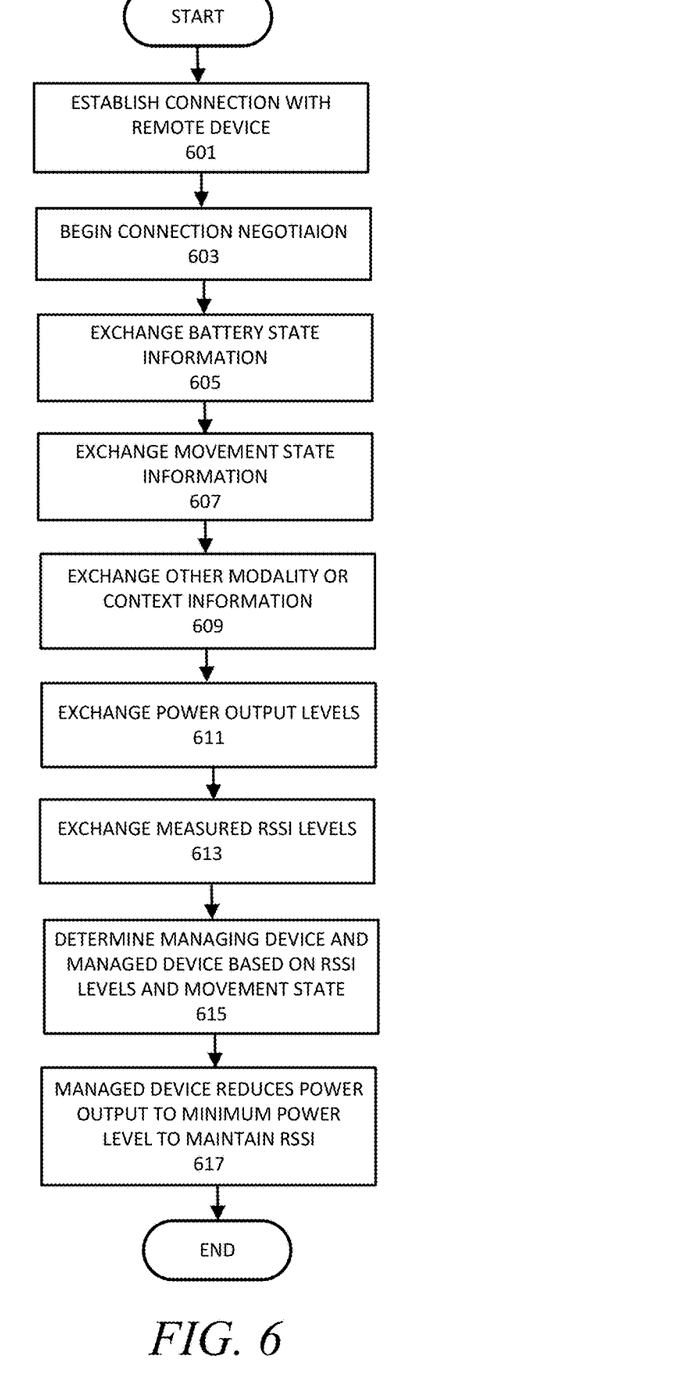
FIG. 6 is a flow chart showing a method of operation in accordance with various embodiments.

The flowchart of FIG. 6 provides an example method of operation of the mobile device 500 in accordance with an embodiment. In operation block 601, a mobile device such as mobile device 500, establishes a connection with a remote device. In operation block 603, the mobile device 500 begins a connection negotiation with the remote device. The negotiation can be initiated by the power adjust module 562 which is operative to compare context information received from the context module 551 with context information received from the remote device. A handshaking operation occurs between the devices that includes acknowledgement of received context information. In operation block 605, the mobile device 500 and the remote device exchange battery state information such as, but not limited to, battery charge level, current or predicted battery discharge rates, and/or other information that may impact the battery discharge rate. For example, the context module 551 may use the mobile device 500 modality information and movement information to infer the mobile device 500 context; and each device context may have an associated battery discharge rate. By using modality information and movement information to infer context, the mobile device 500 can derive its expected battery discharge rate and convey this information to the remote device during the negotiation. In operation 607, the mobile device 500 and the remote device exchange movement state information. The movement state information is obtained by each device using its accelerometer 523, magnetometer 524, and gyroscope 522. In operation 609, the mobile device 500 and a remote device exchange other modality or context information. The context module 551 provides the mobile device 500 information as modality/context information 563. In operation 611, the devices exchange power output levels such as their maximum output power which is used to determine the devices' respective radio coverage ranges. In operation 613, each of the devices exchanges their respective measured RSSI levels. In operation 615, the two devices determine which will assume the role of managed device and which will assume the role of managing device based on the contexts, RSSI levels and movement state of each device. This negotiation and role assignment is determined by the power adjust module 562 and the corresponding power adjust module in the remote connected device. In operation 617, the managed device reduces its power output to its minimum power level necessary to maintain the required RSSI level such that the RSSI is the same as measured by each device. The method of operation then terminates as shown.

Figure 7:
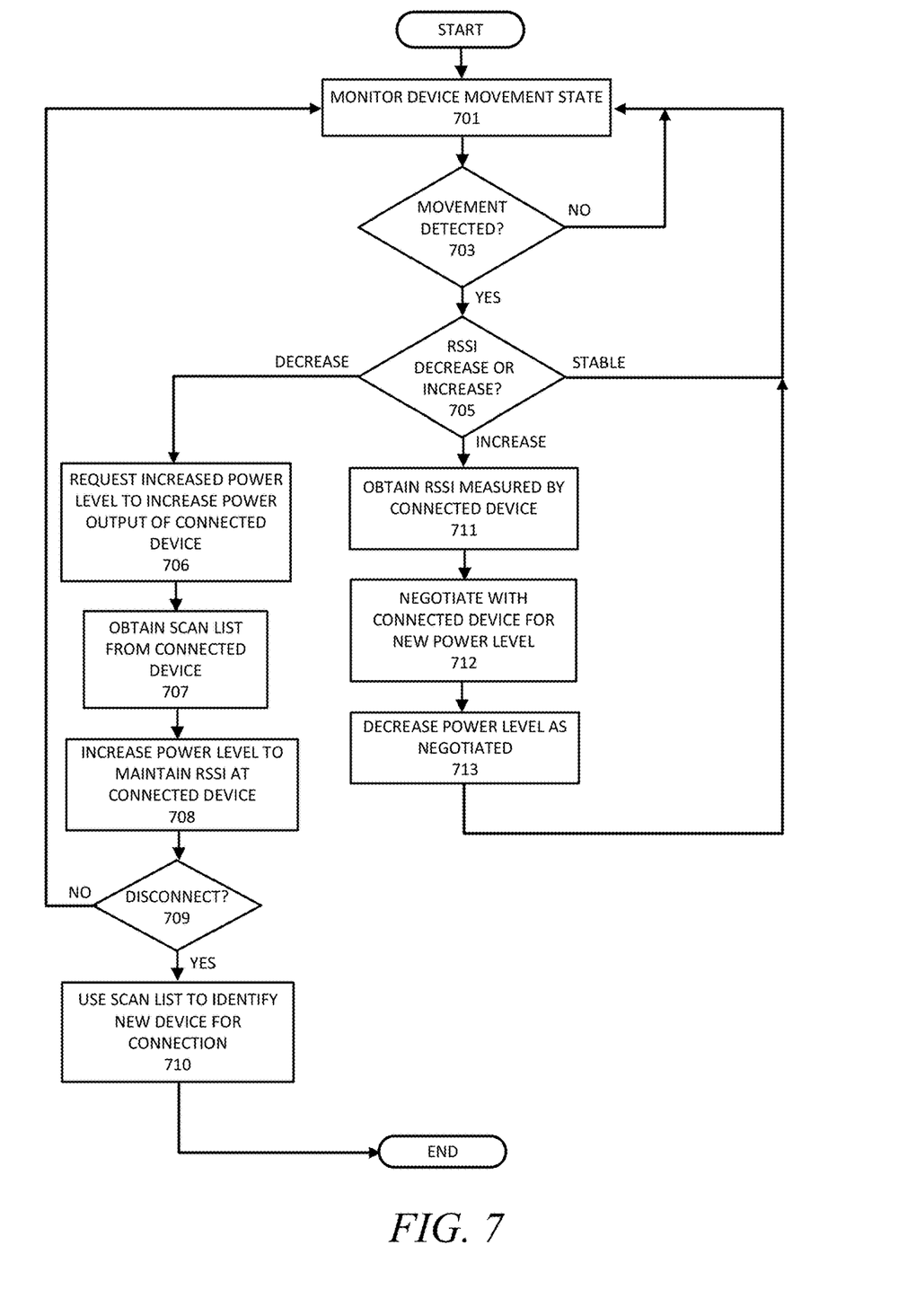
FIG. 7 is a flow chart showing a method of operation in accordance with various embodiments.

The flowchart of FIG. 7 provides another example method of operation of a mobile device 500 in accordance with an embodiment. The method of operation begins and in operation 701, the movement determination module 561 begins to monitor the mobile device 500 movement state. If no movement is detected in decision block 703, the mobile device continues to monitor its device movement state in operation block 701.

If movement is detected in decision block 703, then the method of operation proceeds to decision block 705. In decision block 705, the power adjust module 562 determines whether the mobile device 500 measured RSSI level is stable, increasing or decreasing. If the RSSI level measured by the mobile device 500 is stable, then no action is taken and the movement determination module 561 continues to monitor the mobile device 500 movement state in operation block 701. If the RSSI level is determined to be increasing in decision block 705, then the mobile device will request and obtain the RSSI level measured by the connected device as shown in operation block 711. The power adjust module 562 will then negotiate with the connected device for a new power level as shown in operation block 712. In operation block 713, the power adjust module 562 will send a power adjustment control signal 553 to the power control module 512 to accordingly decrease the WLAN transceiver 511 output power level as negotiated with the connected device. The method of operation will then continue by returning to operation block 701 and monitoring the device movement state.

If the RSSI level is determined to be decreasing at decision block 705, then the method of operation proceeds to operation block 706. In operation 706, the power adjust module 562 communicates with the connected device and requests that the connected device increase its output power level to increase its radio range. In operation block 707, the mobile device 500 also obtains the scan list from the connected device. In operation block 708, the power adjust module 562 may also increase the WLAN transceiver 511 power level to maintain the RSSI level measured by the connected device. The method of operation then proceeds to decision block 709.

In decision block 709, if the remote connected device becomes disconnected from mobile device 500, then in operation block 710 the mobile device 500 will use the scan list to identify a new device for connection. The method of operation then terminates as shown. As long as the remote device is not disconnected in decision block 709, the method of operation continues to monitor the device movement state in operation block 701, and will respond accordingly to any state changes.

Figure 8:
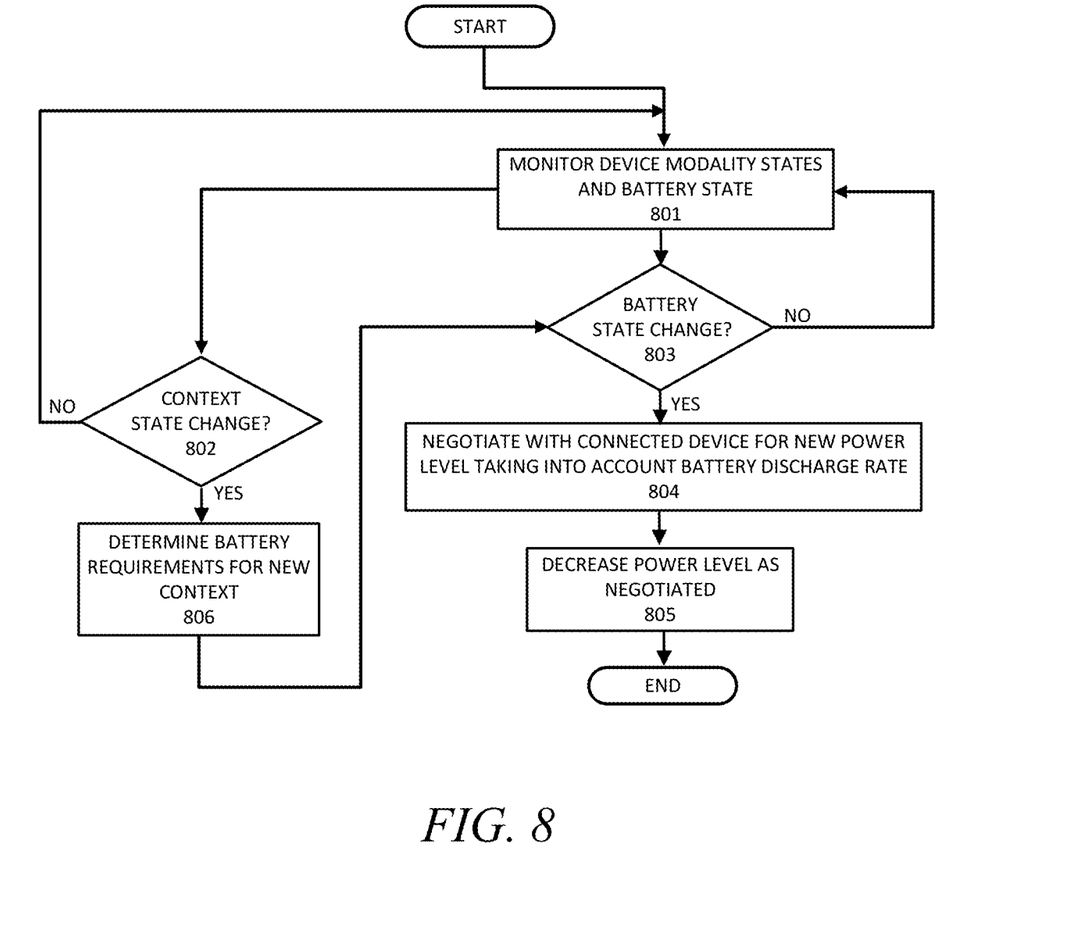
FIG. 8 is a flow chart showing a method of operation in accordance with an embodiment.

FIG. 8 is a flow chart showing another method of operation of the mobile device 500 in accordance with an embodiment. The method of operation begins and in operation block 801, the modality gathering module 552 monitors the mobile device 500 modality states and battery state. The modality gathering module 552 obtains battery state information from the battery monitor 528 and sensor processor 521 which conveys the information to the modality gathering module 552.

In decision block 802, the context module 551 receives the modality information from the modality gathering module 552 via the APIs 564 and determines if a context state change has occurred. If no context state change has occurred, the context module 551 continues to receive modality information from the modality gathering module 552, and thereby monitor the mobile device 500 modality states, including battery states, as shown in operation block 801. However, if the context module 551 determines that s context state change has occurred at decision block 802, then in operation block 806 the context module 551 determines the battery requirements for the new context. The method of operation then proceeds to decision block 803 and the context module 551 monitors for battery state changes. If the battery state has not changed in decision block 803, then the context module 551 continues to monitor modality states and battery state in operation block 801. However, if the battery state has changed in decision block 803, by for example experiencing either an increase or decrease in the battery discharge rate, then the method of operation proceeds to operation block 804. In operation block 804, the context module 551 conveys the state changes to the power adjust module 562 via the APIs 564. The power adjust module 562 then negotiates with the connected device for a new power level that takes into account the change in battery discharge rate. In operation block 805, the power adjust module 562 may increase or decrease the WLAN transceiver 511 output power level as negotiated with the connected device. The method of operation then ends as shown.

Figure 9:
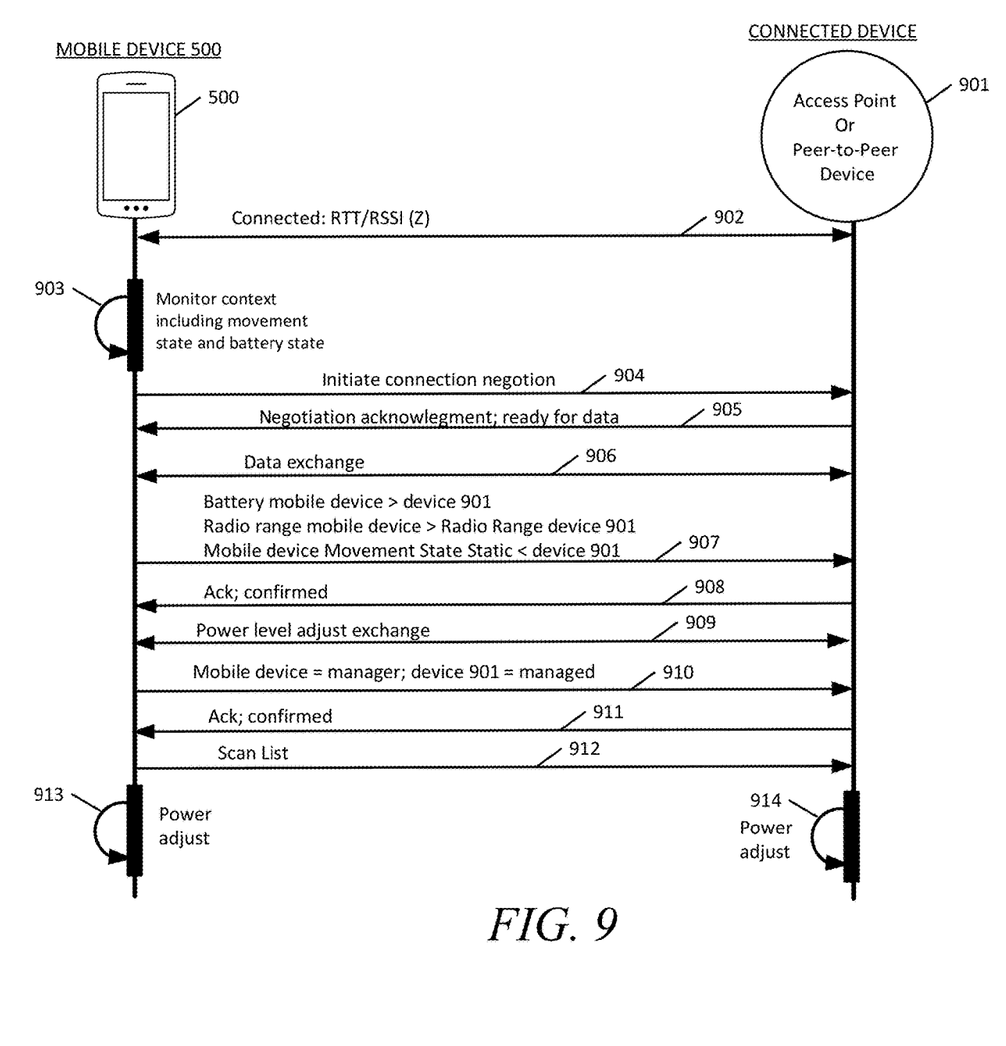
FIG. 9 is a ladder message flow diagram showing an example negotiation between a mobile device and a connected device in accordance with an embodiment.

FIG. 9 provides an example method of operation for negotiation between the mobile device 500 and a connected device 901. The mobile device 500 initially forms a connection with the connected device 901 as shown by connection operation 902. Subsequent to the connection, the mobile device 500 begins to monitor its context state including movement state and battery state as shown by operation 903. The connected device 901 performs a similar operation. The negotiation begins at operation 904, with the mobile device 500 sending a negotiation initiation message 904 to the connected device 901. The connected device 901 sends a negotiation acknowledgment 905 indicating that it is ready to receive data. The mobile device 500 and connected device 901 then perform data exchange operation 906. The devices process this information and make comparisons. The mobile device 500 then sends a data comparison 907 to the connected device 901. In some embodiments, the connected device 901 may send its own comparison to mobile device 500. The data comparison 907 may include, among other things, a comparison of the battery levels of the two devices, comparison of the radio ranges of the two devices and a comparison of the movement states of the two devices. In the example of FIG. 9, the battery of the mobile device 500 has a greater battery charge level than the connected device 901. Also, the radio range of mobile device 500 is greater than radio range of connected device 901, and the mobile device 500 movement state is static while the connected device 901 has exhibited some movement. The connected device 901 sends an acknowledgment 908 which confirms that the connected device 901 processing agrees with the data comparison 907. The mobile device 500 and connected device 901 then exchange their respective power level adjustment determinations as power level adjustment exchange operation 909.

In the example of FIG. 9, the mobile device 500 performs the role assignments, and determines that the mobile device 500 will be assigned the role of manager device and that the connected device 901 will be assigned the role of managed device. In some embodiments, this can be done by the connected device 901. In this example, because the mobile device 500 initiated the negotiation by negotiation initiation message 904, it is given the privilege of determining the roles as shown by role assignment message 910. The connected device 901 the sends an acknowledgment 911 confirming the role assignment. The mobile device 500 then assumes the manage device role and sends its the scan list 912 to the connected device 901. In operation 913, the mobile device 500 performs a power adjustment according to the power level adjustment exchange 909, and the connected device 901 likewise performs its power adjustment operation 914.

The devices then monitor their respective context and movement states and either device can send an initiate negotiation message to refresh the connection parameters. Also, the devices can switch roles depending on their respective states. This process continues until the devices are disconnected.

While various embodiments have been illustrated and described, it is to be understood that the invention is not so limited. Numerous modifications, changes, variations, substitutions and equivalents will occur to those skilled in the art without departing from the scope of the present invention as defined by the appended claims.

What is claimed is:

1. A mobile device, comprising:
   a wireless transceiver operative to establish a wireless connection with a connected device, comprising a peer-to-peer device or an access point;
   a battery monitor;
   a processor, operatively coupled to the wireless transceiver and to the battery monitor, the processor operative to:
      obtain a charge level from the battery monitor;
      negotiate with a connected device for a transceiver power output level based on the charge level; and
      control the wireless transceiver to reduce the wireless transceiver power output to the negotiated transceiver power output level in response to an acknowledgement message from the connected device.

2. The mobile device of claim 1, further comprising:
   an inertial measurement unit, operatively coupled to the processor; and
   where the processor is further operative to:
      obtain movement data from the inertial measurement unit and obtain received signal strength indication (RSSI) measurements from the wireless transceiver;
      determine that the mobile device is moving with respect to a radio coverage area of the connected device based on the movement data and a change in RSSI measurements; and
      negotiate with the connected device for a new transceiver power output level based on the movement data and the change in RSSI measurements.

3. The mobile device of claim 2, further comprising:
   a sensor processor, operatively coupled to the processor, to the inertial measurement unit and to the battery monitor;
   a group of sensors comprising touch sensors, an ambient light sensor and an audio monitor, operatively coupled to the sensor processor;
   where the processor is further operative to:

obtain sensor data from the group of sensors, from the sensor processor;

determine a mobile device operational context using the sensor data;

determine a battery discharge rate using the charge level and the mobile device operational context; and negotiate with the connected device for the new transceiver power output level based on the movement data, the change in RSSI measurements and the battery discharge rate.

4. The mobile device of claim 3, where the processor is operative to determine the mobile device operational context as a mobile device operational context selected from a group consisting of: walking, running, driving, device-in-hand, device-in-pocket, in a noisy environment, in poor coverage area, low battery power, on public transportation, at location x, on a phone call, at work, at school, in a meeting, browsing, texting, phone call, and gaming.

5. The mobile device of claim 1, where the processor is further operative to:

exchange battery level and received signal strength indication measurements with the connected device during negotiation.

6. The mobile device of claim 5, where the processor is further operative to:

exchange battery discharge rates with the connected device during negotiation.

7. The mobile device of claim 5, where the processor is further operative to:

exchange operational contexts with the connected device during negotiation.

8. The mobile device of claim 1, where the processor comprises:

a power adjust module, operative to send a power adjustment control signal to the wireless transceiver to reduce the wireless transceiver power output to the negotiated transceiver power output level in response to an acknowledgement message from the connected device.

9. The mobile device of claim 8, where the power adjust module is operative to:

receive the acknowledgement message from the connected device; and send the power adjustment control signal to the wireless transceiver in response to the acknowledgement message.

10. The mobile device of claim 3, where the processor further comprises:

a movement determination module, operative to communicate with the sensor processor to obtain movement data from the inertial measurement unit.

11. A method of operating a mobile device, comprising:

operating a wireless transceiver to establish a wireless connection with a connected device, comprising a peer-to-peer device or an access point;

obtaining a charge level from a mobile device battery monitor;

negotiating with the connected device for a transceiver power output level based on the charge level; and controlling the wireless transceiver to reduce the wireless transceiver power output to the negotiated transceiver power output level in response to an acknowledgement message from the connected device.

12. The method of claim 11, further comprising:

obtaining movement data from an inertial measurement unit;

obtaining received signal strength indication (RSSI) measurements from the wireless transceiver;

determining that the mobile device is moving with respect to a radio coverage area of the connected device based on the movement data and a change in RSSI measurements; and negotiating with the connected device for a new transceiver power output level based on the movement data and the change in RSSI measurements.

13. The method of claim 12, further comprising:

obtaining sensor data from a group of sensors comprising touch sensors, an ambient light sensor and an audio monitor;

determining a mobile device operational context using the sensor data;

determining a battery discharge rate using the charge level and the mobile device operational context; and negotiating with the connected device for the new transceiver power output level based on the movement data, the change in RSSI measurements and the battery discharge rate.

14. The method of claim 13, further comprising:

determining the mobile device operational context as a mobile device operational context selected from a group consisting of: walking, running, driving, device-in-hand, device-in-pocket, in a noisy environment, in poor coverage area, low battery power, on public transportation, at location x, on a phone call, at work, at school, in a meeting, browsing, texting, phone call, and gaming.

15. The method of claim 11, further comprising exchanging battery level and received signal strength indication measurements with the connected device during negotiation.

16. The method of claim 15, further comprising exchanging battery discharge rates with the connected device during negotiation.

17. The method of claim 15, further comprising exchanging operational contexts with the connected device during negotiation.

18. The method of claim 11, further comprising:

sending a power adjustment control signal to the wireless transceiver to reduce the wireless transceiver power output to the negotiated transceiver power output level in response to an acknowledgement message from the connected device.

19. The method of claim 18, further comprising receiving, by a power adjust module, the acknowledgement message from the connected device; and sending, by the power adjust module, the power adjustment control signal to the wireless transceiver in response to the acknowledgement message.

20. A mobile device, comprising:

a wireless transceiver operative to establish a wireless connection with a connected device, comprising a peer-to-peer device or an access point;

a processor, operatively coupled to the wireless transceiver and to a battery monitor, the processor operative to:

obtain a charge level from a battery monitor;

obtain a network scan list from the connected device; and control the wireless transceiver to reduce the wireless transceiver power output to a negotiated transceiver power output level in response to negotiation with the connected device based on the charge level.

* * * * *